(12) United States Patent
Shimizu et al.

(10) Patent No.: US 12,392,801 B2
(45) Date of Patent: Aug. 19, 2025

(54) PROBE CARD

(71) Applicant: JAPAN ELECTRONIC MATERIALS CORPORATION, Hyogo (JP)

(72) Inventors: Tatsunori Shimizu, Hyogo (JP); Tsutomu Shoji, Hyogo (JP); Yuji Kawasaki, Hyogo (JP); Tomohiro Kinoshita, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 153 days.

(21) Appl. No.: 18/567,374

(22) PCT Filed: Jun. 10, 2021

(86) PCT No.: PCT/JP2021/022080
§ 371 (c)(1),
(2) Date: Dec. 6, 2023

(87) PCT Pub. No.: WO2022/259454
PCT Pub. Date: Dec. 15, 2022

(65) Prior Publication Data
US 2024/0280610 A1    Aug. 22, 2024

(51) Int. Cl.
*G01R 1/067* (2006.01)
*G01R 1/073* (2006.01)

(52) U.S. Cl.
CPC ..... *G01R 1/06794* (2013.01); *G01R 1/07342* (2013.01)

(58) Field of Classification Search
CPC .......... G01R 1/06794; G01R 1/07342
See application file for complete search history.

(56) References Cited

U.S. PATENT DOCUMENTS 6,774,652 B2   8/2004  Isa
7,342,402 B2 * 3/2008  Kim ................... G01R 1/06744
                                                324/754.14
(Continued)

FOREIGN PATENT DOCUMENTS

JP    2005533263 A   11/2005
JP    2010182749 A    8/2010
(Continued)

OTHER PUBLICATIONS

Office Action issued in corresponding Korean Patent Application No. 10-2023-7042185 dated Mar. 25, 2025 (7 pages).
(Continued)

*Primary Examiner* — Paresh Patel
(74) *Attorney, Agent, or Firm* — Kilyk & Bowersox, P.L.L.C.

(57) ABSTRACT

Suppresses reflection from a circuit board including a light-transparent insulating film formed on an interlayer wiring to easily identify an alignment mark formed on a probe. The probe card comprises a circuit board 103 on which an insulating film 304 and an electrode pad 3 are formed and a probe 5 attached onto the electrode pad 3. The probe 5 has an alignment mark 7 identifiable from an opposite side of the circuit board 103. The alignment mark 7 is positioned outside of the electrode pad 3 on the circuit board 103. The insulating film 304 is a light-transmissive thin film covering an interlayer wiring 314. An anti-reflection film 6 with lower light transmittance than the insulating film 304 is formed in some regions on the insulating film 304. The anti-reflection film 6 is formed on a position corresponding to the alignment mark 7 and a region surrounding the position.

9 Claims, 16 Drawing Sheets

(56) References Cited

U.S. PATENT DOCUMENTS

| | | | | |
|---|---|---|---|---|
| 7,589,543 | B2* | 9/2009 | Yamada | G01R 31/2891 |
| | | | | 324/750.19 |
| 7,977,957 | B2* | 7/2011 | Bohm | G01R 1/06794 |
| | | | | 324/750.16 |
| 10,935,574 | B2* | 3/2021 | Kim | G01R 31/2891 |
| 2007/0001707 | A1* | 1/2007 | Bohm | G01R 31/2808 |
| | | | | 324/754.1 |
| 2007/0024297 | A1* | 2/2007 | Ismail | G01R 3/00 |
| | | | | 324/755.05 |
| 2007/0076203 | A1 | 4/2007 | Ishibashi et al. | |
| 2009/0009201 | A1 | 1/2009 | Miyagi et al. | |
| 2010/0219854 | A1 | 9/2010 | Kuniyoshi et al. | |
| 2017/0199225 | A1 | 7/2017 | Takesako et al. | |
| 2017/0205443 | A1 | 7/2017 | Bolt et al. | |
| 2024/0385221 | A1* | 11/2024 | Cheng | G01R 1/06761 |

FOREIGN PATENT DOCUMENTS

| | | |
|---|---|---|
| JP | 201127538 A | 2/2011 |
| JP | 2014202558 A | 10/2014 |
| JP | 201582587 A | 4/2015 |
| JP | 202156293 A | 4/2021 |
| KR | 10-2011-0042562 A | 4/2011 |
| KR | 10-2021-0044615 A | 4/2021 |

OTHER PUBLICATIONS

International Search Report and Written Opinion issued in corresponding International Patent Application No. PCT/JP2021/022080 (with English translation of International Search Report) mailed Aug. 31, 2021 (6 pages).

\* cited by examiner

A-A CROSS-SECTIONAL VIEW

FIG. 9
(a) CAPTURED IMAGE OF AREA R1
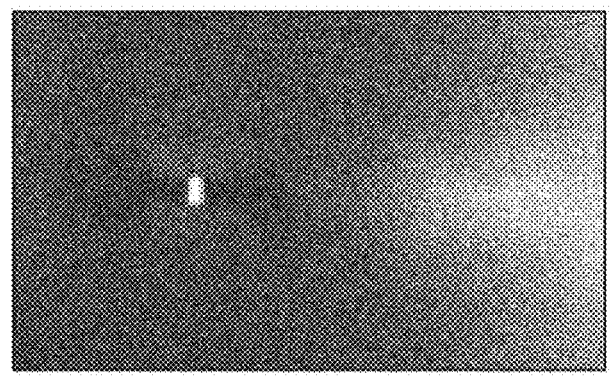
(b) CAPTURED IMAGE OF AREA R2 (COMPARATIVE EXAMPLE)
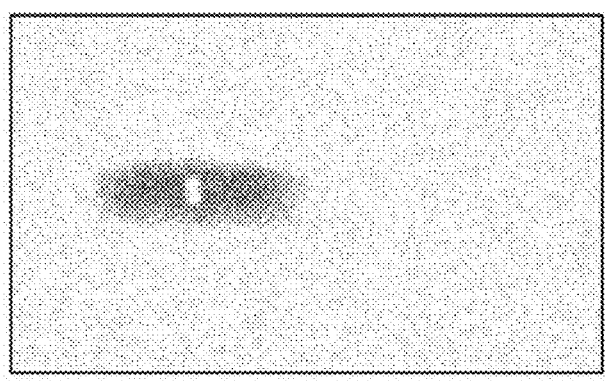

A-A CROSS-SECTIONAL VIEW

PROBE CARD

This application is a National Stage Application of PCT/JP2021/022080, filed Jun. 10, 2021.

TECHNICAL FIELD

The present invention relates to a probe card, and more particularly to an improvement of a probe card in which an alignment mark is formed on the probe.

BACKGROUND OF THE INVENTION

A probe card is an inspection device used to inspect the electrical characteristics of semiconductor devices formed on a semiconductor wafer and is equipped with a number of probes on a circuit board that contact the electrode terminals on the semiconductor wafer respectively.

Inspection of semiconductor devices is performed by bringing the semiconductor wafer close to the probe card, bringing the tip of the probe into contact with the electrode terminal on the semiconductor wafer, and allowing the tester device to conduct with the semiconductor device via the probe and the circuit board. The probe card and semiconductor wafer are aligned prior to inspection so that the probe tip can contact the corresponding electrode terminal.

The alignment is performed by identifying an alignment mark on the probe card. For example, the position and posture of the probe card can be identified by photographing one or two or more alignment marks on the circuit board or on the probe, extracting each of the alignment marks from the photographed image, and identifying its position (see, e.g., Patent Literatures 1 to 4).

CITATION LIST

Patent Literatures

[Patent Literature 1] JP 2011-27538 A
[Patent Literature 2] JP 2005-533263 A
[Patent Literature 3] JP 2010-182749 A
[Patent Literature 4] JP 2004-138393 A

SUMMARY OF THE INVENTION

Technical Problem

An insulating film is formed on the probe mounting surface of the circuit board to cover an interlayer wiring. If a photosensitive polymer is used for the insulating film, the insulating film can be patterned by exposure and development without forming a photoresist on the insulating film, simplifying the manufacturing process.

However, the photosensitive polymer should be a material with light transmittance. Therefore, if the photosensitive polymer is used for the insulating film, reflected light from the circuit board increases when an alignment mark is photographed, making it difficult to identify the alignment mark. For example, there is a problem that the illumination light transmitted through the insulating film is directly reflected by the interlayer wiring, resulting in strong reflected light, and the reflected light diffusely reflected by the edge of the interlayer wiring, etc., becomes stray light in the insulating film, making the entire insulating film bright due to diffuse reflection.

In particular, when an alignment mark is formed on the probe, the insulating film that becomes the background of the alignment mark reflects illumination light and becomes bright, reducing the contrast of the alignment mark and making difficult to identify the alignment.

The present invention is made in view of the above problems and the objective of the present invention is to enable easy identification of an alignment mark formed on a probe. In particular, the object of the present invention is to make it possible to easily identify an alignment mark formed on a probe by suppressing reflected light from a circuit board on which a light-transparent insulating film is formed over interlayer wiring. Moreover, the objective of the present invention is to simplify the manufacturing method of the probe card.

Solution to the Problem

A probe card of a first embodiment comprising a circuit board on which an insulating film and an electrode pad are formed and a probe attached onto the electrode pad, wherein the probe includes an alignment mark identifiable from an opposite side of the circuit board, the alignment mark is positioned outside of the electrode pad on the circuit board, the insulating film is a light-transmissive thin film covering an interlayer wiring, an anti-reflection film with lower light transmittance than the insulating film being formed in some regions on the insulating film, and the anti-reflection film is formed on a position corresponding to the alignment mark and a region surrounding the position.

According to this configuration, when illumination light is irradiated to capture an alignment mark, reflected light from the insulating film can be suppressed. Therefore, it is possible to prevent the alignment mark from being difficult to identify due to reflected light from the interlayer wiring covered by the insulating film or stray light in the insulating film.

A probe card of a second embodiment is configured such that, in addition to the above configuration, the anti-reflection film is light-impermeable. With this configuration, it is possible to effectively prevent the alignment mark from becoming difficult to identify.

A probe card of a third embodiment is configured such that, in addition to the above configuration, the insulating film is made of a photosensitive polymer and patterned by processes of exposure and development. With this configuration, it is possible to simplify the forming process of the insulating layer compared to patterning by photolithography process using photosensitive photoresist.

A probe card of a fourth embodiment is configured such that, in addition to the above configuration, the anti-reflection film is formed by selective application using a fine nozzle. With this configuration, it is possible to simplify the forming process of the anti-reflection film compared to patterning by photolithography process using photosensitive photoresist.

A probe card of a fifth embodiment is configured such that, in addition to the above configuration, the anti-reflection film has a lower reflectance than the insulating film. With this configuration, it is possible to easily identify the alignment mark.

A probe card of a sixth embodiment is configured such that, in addition to the above configuration, the anti-reflection film is formed so that it does not overlap with the electrode pad. With this configuration, it is possible to prevent poor probe continuity due to the narrowing of the electrode pad.

A probe card of a seventh embodiment is configured such that, in addition to the above configuration, a plurality of the probes is aligned in a predetermined direction to form a probe group, and the anti-reflection film has an elongated shape extending along the probe group and is formed on a position corresponding to the alignment mark of the plurality of the probes of the probe group and a region surrounding the position. With this configuration, it is possible to easily identify the alignment mark for each probe of the probe group. Moreover, it is possible to simplify the forming process of the antireflection film.

A probe card of an eighth embodiment is configured such that, in addition to the above configuration, two of the probe groups are arranged parallel to each other, and the anti-reflection film is formed between the two probe groups and on a position corresponding to the alignment mark of the plurality of the probes of each of the two probe groups and a region surrounding the position. With this configuration, it is possible to easily identify the alignment mark for each probe of the two probe groups. Moreover, it is possible to simplify the forming process of the anti-reflective film.

A probe card of a ninth embodiment is configured such that, in addition to the above configuration, a distance from both ends of the anti-reflection film in a longitudinal direction to a position corresponding to a nearest alignment mark is longer than a distance from both ends of the anti-reflection film in the shortitudinal direction to a position corresponding to the alignment mark. With this configuration, it is possible to identify more easily the alignment mark for each probe of the probe group.

Advantages of the Invention

According to the present invention, an alignment mark formed on a probe can be easily identified. In particular, the alignment mark formed on the probe can be easily identified by suppressing reflected light from a circuit board, where a light-transmissive insulating film is formed on the interlayer wiring. Moreover, the manufacturing method of the probe card can be simplified.

BRIEF DESCRIPTION OF DRAWINGS

FIG. 9 illustrates an example of the images taken of area R1 in FIG. 7 and area R2 in FIG. 8.

DETAILED DESCRIPTION OF THE INVENTION

First Embodiment

[A] System Overview

Figure 1:
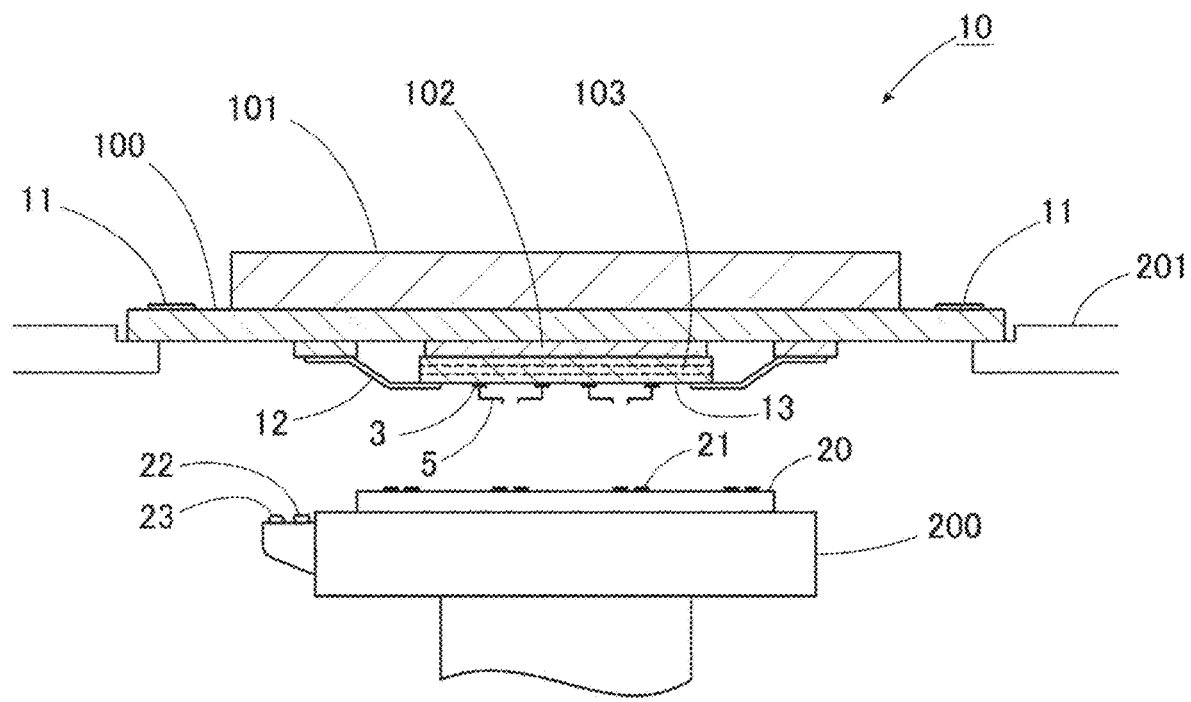
FIG. 1 illustrates a schematic diagram of the entire system including a probe card 10 according to a first embodiment of the present invention.

FIG. 1 illustrates a schematic diagram of the entire system including a probe card 10 according to a first Embodiment of the present invention, illustrating a cross-section of the probe card 10 placed on a wafer prober, cut in the vertical plane. The probe card 10 is mounted on the wafer prober with the probe mounting surface 13, on which a probe 5 is mounted, facing down. The probe mounting surface 13 faces a semiconductor wafer 20 on a stage 200, and by moving the stage 200 up and down, the probe 5 can be brought into contact with an electrode terminal 21 on the semiconductor wafer 20.

(1) Probe Card 10

The probe card 10 has of a main board 100, a reinforcing plate 101, an interposer 102, an ST (Space Transformer) board 103, and two or more probes 5.

The main board 100 is a circuit board that is removably attached to the wafer prober, for example, a disc-shaped glass epoxy board can be used. The main board 100 is supported by a card holder 201 of the wafer prober at the outer edge of its lower surface and is placed substantially horizontally. The outer edge of the upper surface of the main board 100 is provided with two or more external terminals 11 to which signal terminals of a tester device (not shown) are connected.

The reinforcing plate 101 is a member for controlling distortion of the main board 100, for example, a stainless-steel metal block can be used. The reinforcing plate 101 is attached to the center of the top surface of the main board 100.

The interposer 102 is a means for connecting the main board 100 and the ST board 103 each other. The interposer 102 is arranged on the lower surface side of the main board 100 and has a number of pogo pins that conduct the wiring of the main board 100 to the wiring of the ST board 103.

The ST board 103 is a circuit board for converting a pitch between electrodes. Wirings are formed on the probe mounting surface 13 at a smaller pitch than the main board 100. The ST board 103 is an insulating multilayer wiring board, for example, a laminate of two or more ceramic boards can be used. The ST board 103 is arranged on the underside of the main board 100 via the interposer 102. The ST board 103 is supported by the main board 100 with a board holder 12 and is arranged substantially horizontally.

The probe mounting surface 13 is the lower surface of the ST board 103, on which two or more electrode pads 3 are formed. The electrode pad 3 is an electrode to which the probe 5 is attached and is arranged to correspond to the electrode terminal 21 on the semiconductor wafer 20.

(2) Stage 200

The stage 200 is a platform on which the semiconductor wafer 20 is placed. The semiconductor wafers 20 as inspection object is placed on the stage 200 so that the electrode terminal 21 is on the top side. The stage 200 can move and rotate in the horizontal plane and move vertically. The stage 200 is also equipped with a camera 22 for alignment and an illuminator 23.

The camera 22 is an imaging means for capturing an image of an alignment mark (not shown) formed on the probe 5, for example, a CCD or COMS image sensor can be used. The camera 22 is arranged so that its light receiving axis 24 is substantially perpendicular to the probe mounting surface 13.

The illuminator 23 is an illumining means for providing illumination light for camera photography, for example, an LED and a laser diode can be used. The illuminator 23 is arranged near the camera 22, directed in the same direction as the camera 22, and illuminates the alignment mark that is the subject of the camera 22. The light emitting axis of the illuminator 23 should be substantially coaxial with the light receiving axis 24 of the camera 22.

(3) Alignment

Figure 2:
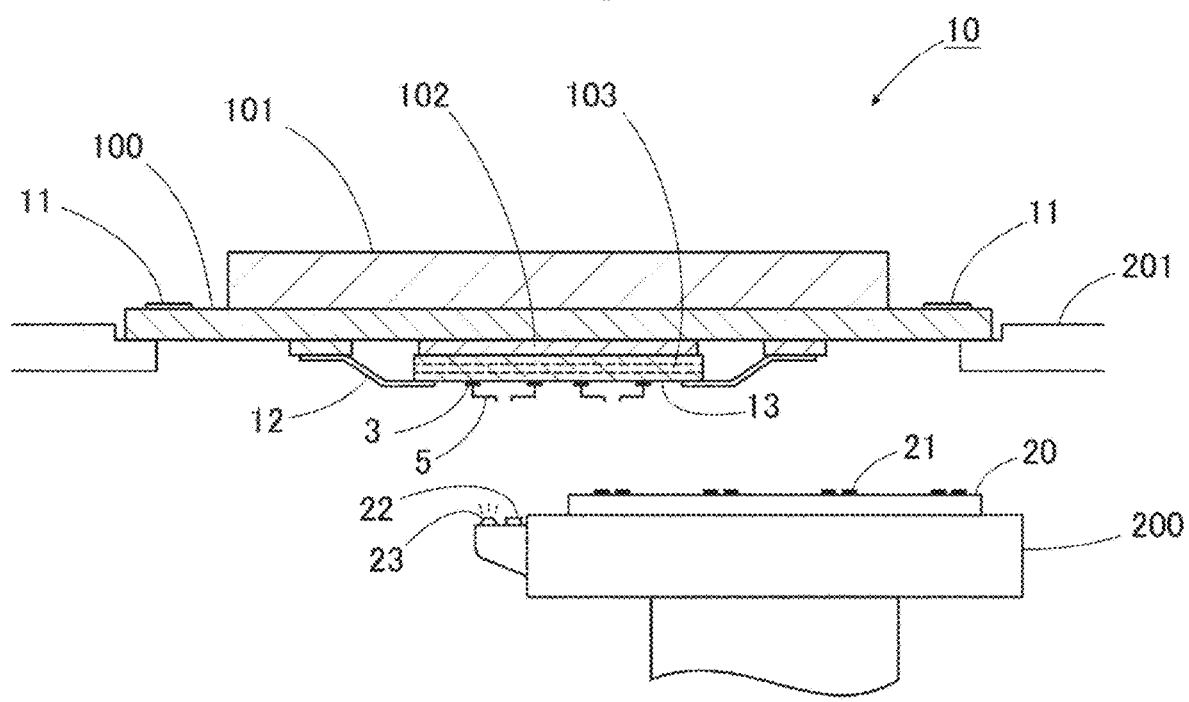
FIG. 2 illustrates the situation during alignment.

FIG. 2 illustrates the situation during alignment, illustrating, as in FIG. 1, a cross-sectional of the probe card 10 placed on the wafer prober, cut in the vertical plane. In order to bring the tip of the probe 5 into contact with the corresponding electrode terminal 21 during inspection, the probe card 10 and the semiconductor wafer 20 are aligned before inspection. The alignment is performed by identifying an alignment mark to identify the position and orientation of probe card 10.

The identification of an alignment mark is performed by sequentially capturing an image of the probe mounting surface 13 with the camera 22 while moving or rotating the stage 200 in the horizontal plane and extracting an alignment mark from the captured image. The position and orientation of the probe card 10 in the wafer prober can be identified by identifying one or two or more alignment marks. If the position of the electrode terminal 21 on the stage 200 is known, the tip of the probe 5 can be brought into contact with the corresponding electrode terminal 21 by moving or rotating the stage 200 based on the position and orientation of the probe card 10 thus identified. Then raising the stage 200, the probe 5 can be brought into contact with the corresponding electrode terminal 21 and inspection can be performed.

Figure 3:
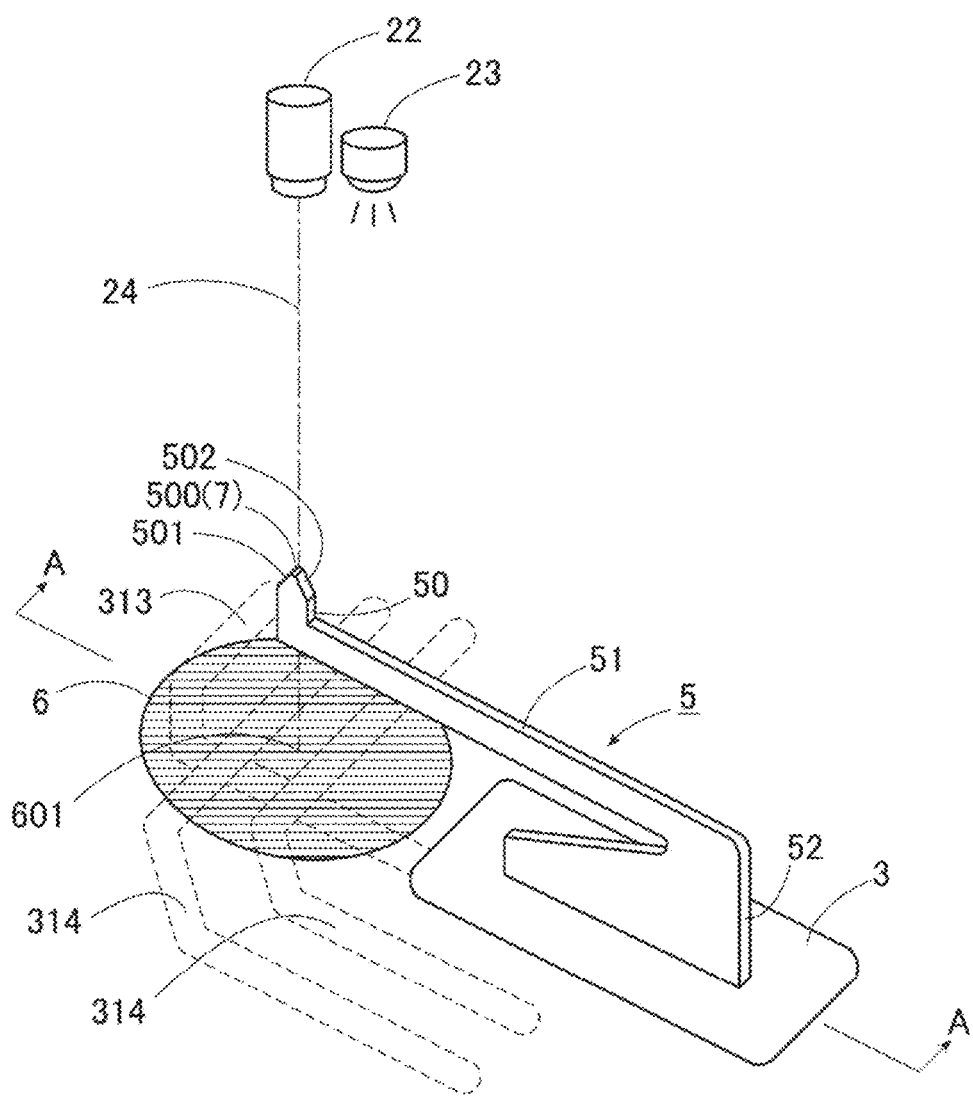
FIG. 3 is a perspective view of a probe mounting surface 13 viewed from the bottom.
Figure 4:
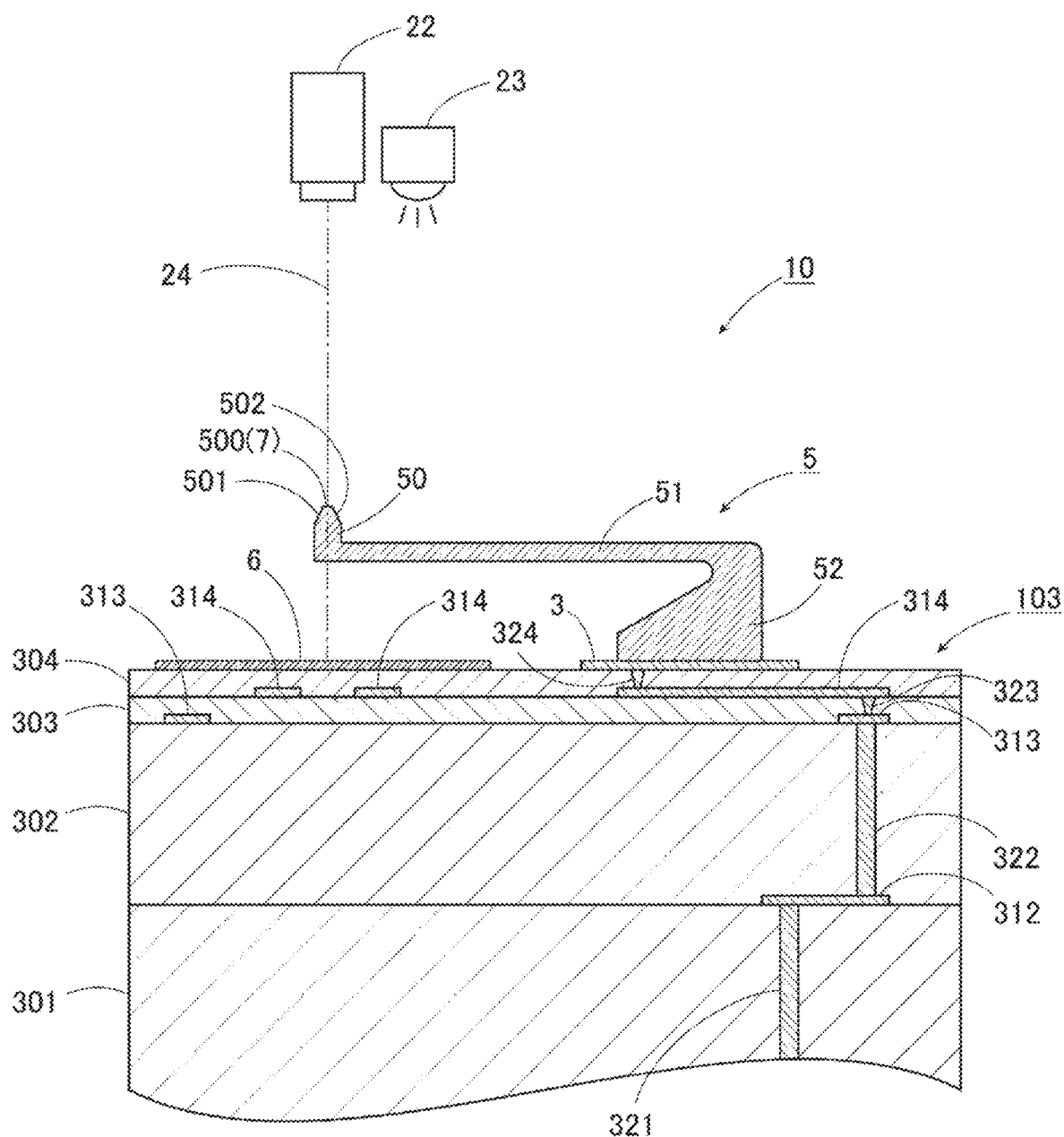
FIG. 4 illustrates a cross-sectional view (A-A cross-sectional view) cut by A-A cut line in FIG. 3.

FIGS. 3 and 4 illustrate how the alignment is performed, focusing on one probe 5. FIG. 3 is a perspective view of a probe mounting surface 13 viewed from the bottom. FIG. 4 illustrates a cross-sectional view (A-A cross-sectional view) cut by A-A cut line in FIG. 3. In FIGS. 3 and 4, the top and bottom are reversed from FIG. 1.

(4) Probe 5

The probe 5 has a contact part 50, a beam part 51, and a base part 52. The contact part 50 is the tip of the probe 5 that is brought into contact with the electrode terminal 21 of the inspection object and is provided at one end of the beam part 51. The base part 52 is a support portion having a bonding surface to be bonded to the electrode pad 3 and is provided at the other end of the beam part 51. The beam part 51 is a connecting portion connecting the contact part 50 and the base part 52 each other and has an elongated shape extending along the ST board 103.

By adopting such a cantilever structure, the probe 5 achieves overdrive by elastic deformation of beam part 51 due to the load that contact part 50 receives from electrode terminal 21. When the base part 52 is attached onto the electrode pad 3, the contact part 50 is positioned outside of the electrode pad 3.

The contact part 50 has a shape that protrudes toward the semiconductor wafer 20. The cross-sectional shape near the tip of the contact part 50 is a trapezoidal shape narrowing toward the tip, and a contact surface 500 and tapered surfaces 501 and 502 are formed along its periphery. The contact surface 500 is a rectangular plane in contact with the electrode terminal 21 and is positioned substantially parallel to the probe mounting surface 13. The tapered surfaces 501 and 502 are both rectangular planes adjacent to the contact surface 500 and are arranged at an angle to the probe mounting surface 13. The tapered surfaces 501 and 502 are arranged to sandwich the contact surface 500 in the longitudinal direction of the beam part 51.

The contact surface 500 and tapered surfaces 501 and 502 are formed as smooth surfaces and reflect illumination light directly. Therefore, illumination light irradiated from a direction perpendicular to the probe mounting surface 13 is reflected in the same direction as the incident direction on the contact surface 500 but is reflected in a direction significantly different from the incident direction on the tapered surfaces 501 and 502.

Therefore, by substantially aligning the light receiving axis 24 of the camera 22 and the light emitting axis of the illuminator 23 and making them substantially perpendicular to the probe mounting surface 13, strong reflected light from the contact surface 500 by normal reflection enters the camera 22, while strong reflected light from the tapered surfaces 501 and 502 does not enter. Therefore, the contact surface 500 becomes a bright area in the captured image, while the tapered surfaces 501 and 502 become dark areas, and edges of contrast difference are generated at the boundaries of the contact surface 500 and the tapered surfaces 501 and 502, enabling extraction by image processing. In other words, the contact surface 500 sandwiched by the tapered surfaces 501 and 502 can be used as the alignment mark 7.

If the angles of the tapered surfaces 501 and 502 are sufficiently large relative to the contact surface 500, the light receiving axis 24 of the camera 22 and the light emitting axis of the illuminator 23 need not be strictly coincident, nor do these axes need to be strictly vertical to the probe mounting surface 13.

(5) ST Board 103

The ST board 103 has one or two or more insulating films 303 and 304 laminated on a laminate of two or more ceramic boards 301 and 302. Interlayer wirings 312 to 314 are formed between each of these layers 301 to 304 and are connected to via holes 321 to 324 that penetrate each layer 301 to 304. On the outermost insulating film 304, the electrode pad 3 and the anti-reflection film 6 are formed, and the electrode pad 3 is connected to the interlayer wiring 314 via the via hole 324 through the insulating film 304. The interlayer wirings 312 to 314, the via holes 321 to 324 and the electrode pad 3 may be made of metal materials with good conductivity, for example, copper (Cu), gold (Au) and aluminum (Al).

Photosensitive polymers, e.g., photosensitive polyimide, are used for the insulating films 303 and 304. Photosensitive polymers, which are patterned by exposure and development, are required to have transparency to photosensitive illumination light. Therefore, materials having transparency in the visible light wavelength range are used for the insulating films 303 and 304. As a result, the interlayer wirings 313 and 314 buried in the insulating films 303 and 304 are visible from the outside.

The anti-reflection film 6 is a light-impermeable thin film formed on the insulating film 304 and covers the insulating film 304 at a position corresponding to the alignment mark 7 and in a region surrounding the position. For example, it is formed in a circular region centered at a position 601 where a perpendicular line from the center of the alignment mark 7 intersects the insulating film 304.

By forming the anti-reflection film 6, the reflected light from the insulating film 304 can be blocked during image capture by the camera. This prevents the background from becoming bright due to reflected light from the interlayer wirings 313 and 314 and stray light in the insulating films 303 and 304, making it difficult to identify the alignment mark 7. Instead of the light-impermeable thin film, a thin film with a lower light transmittance in the visible light region than the insulating film 304 can be used as the anti-reflection film 6.

The anti-reflection film 6 is formed as a thin film with sufficiently low light reflectance. For example, a black resin paint containing carbon can be used. By using such an anti-reflection film 6, light reflected from the insulating film 304 can be suppressed, and reflection on the surface of the anti-reflection film 6 can also be suppressed. As a result, the anti-reflection film 6 can be darker than the insulating film 304 on the image taken by the camera 22.

The reflectance at the surface of the anti-reflective film 6 is preferably lower than the reflectance of the insulating film 304. If the reflectance of the insulating film 304 varies from region to region, it is preferably lower than the average reflectance of the insulating film 304.

The anti-reflection film 6 is formed so that it does not overlap with the electrode pad 3. By forming the anti-reflection film 6 in a region separated from the electrode pad 3, it is possible to prevent the electrode pad 3 from becoming narrower and causing poor contact of the probe 5 with the electrode pad 3.

(6) Manufacturing Method

Figure 5:
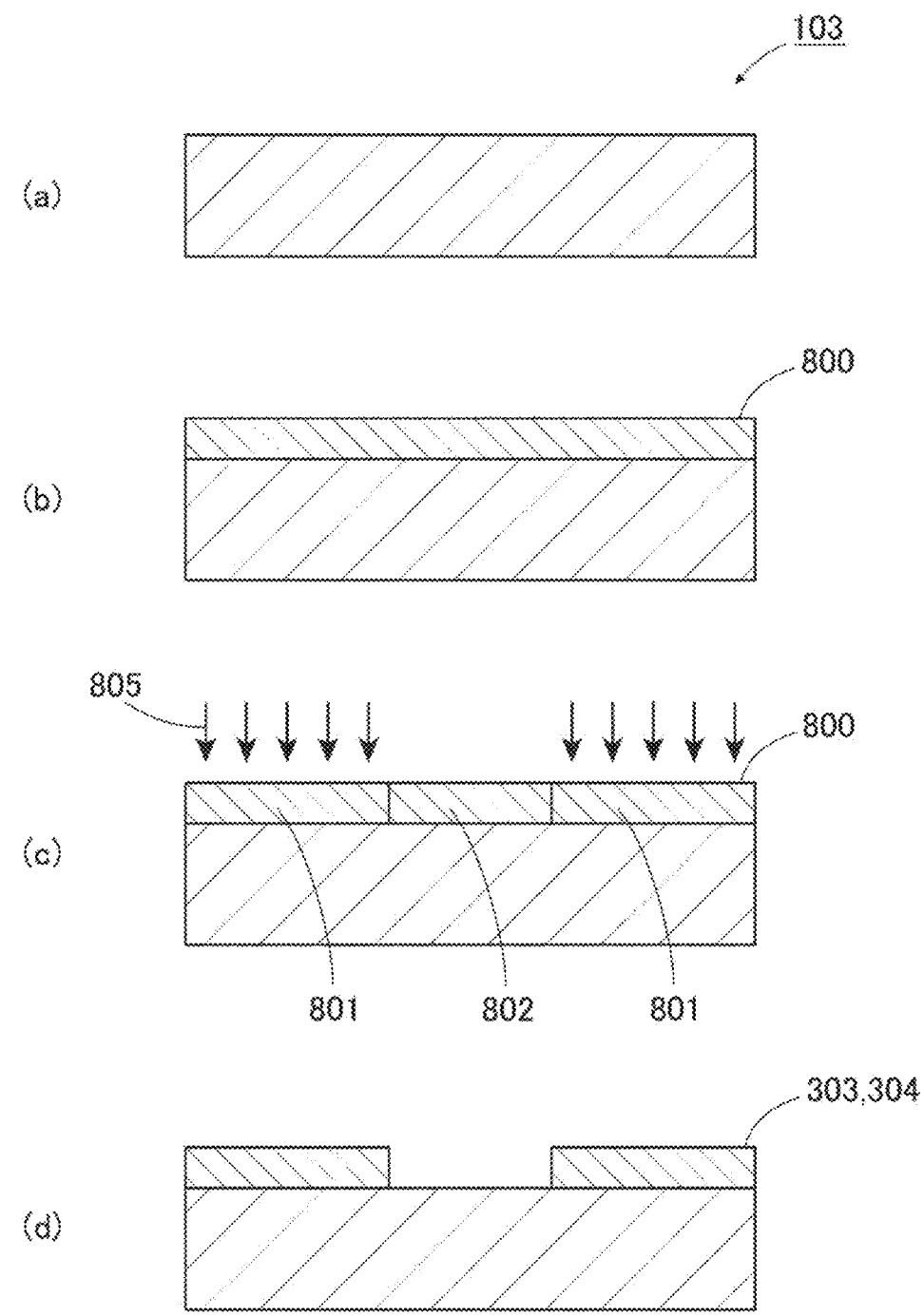
FIG. 5 illustrates an example of the forming process of insulating films 303, 304 in chronological order.

FIG. 5, including parts (a) to (d), illustrates an example of the forming process of insulating films 303 and 304 in chronological order. The part (a) illustrates the ST board 103 before the insulating films 303 and 304 are formed.

The part (b) illustrates the state in which a coating layer 800 is formed on the entire top surface of the ST board 103. The coating layer 800 is formed by coating or film transfer of photosensitive polymer on the ST board 103 and pre-baking. For example, by applying the photosensitive polymer by spin coating, the coating layer 800 is formed on the entire top surface of the ST board 103. The coating layer 800 is then pre-baked to evaporate the solvent by heating to fix the coating layer 800 on the ST board 103.

The part (c) illustrates the situation during exposure. After pre-baking, the coating layer 800 is selectively exposed using a mask with a pattern or a direct writing device to photo-crosslink the photosensitive polymer. The coating layer 800 is divided into two regions: an exposed region 801 where a photosensitive illumination light 805 is irradiated and a non-exposed region 802 where the photosensitive illumination light 805 is not irradiated, and photo crosslinking is performed only within the exposed region 801. Thereafter, post-exposure baking is performed to perform thermal crosslinking.

The part (d) illustrates the post-development state. The coating layer 800, which has been baked after exposure, is developed using a developer, and the coating layer 800 is selectively dissolved and removed. If the photosensitive polymer is a negative type, the non-exposed region 802 is dissolved and removed. Thereafter, curing is performed and the coating layer 800 is cured to form the insulating films 303 and 304.

By forming the insulating films 303 and 304 with photosensitive material, the insulating films 303 and 304 can be patterned by selective exposure and development without forming a photoresist on the insulating films 303 and 304. Therefore, the process of applying and removing the photoresist becomes unnecessary, and the manufacturing process can be simplified.

The photosensitive illumination light 805 must reach not only the surface of the coating layer 800 but also its interior, and the photosensitive material used for the coating layer 800 must have transparency to the photosensitive illumination light 805. For this reason, photosensitive materials having transparency in the visible light wavelength range are used for the insulating films 303 and 304.

Figure 6:
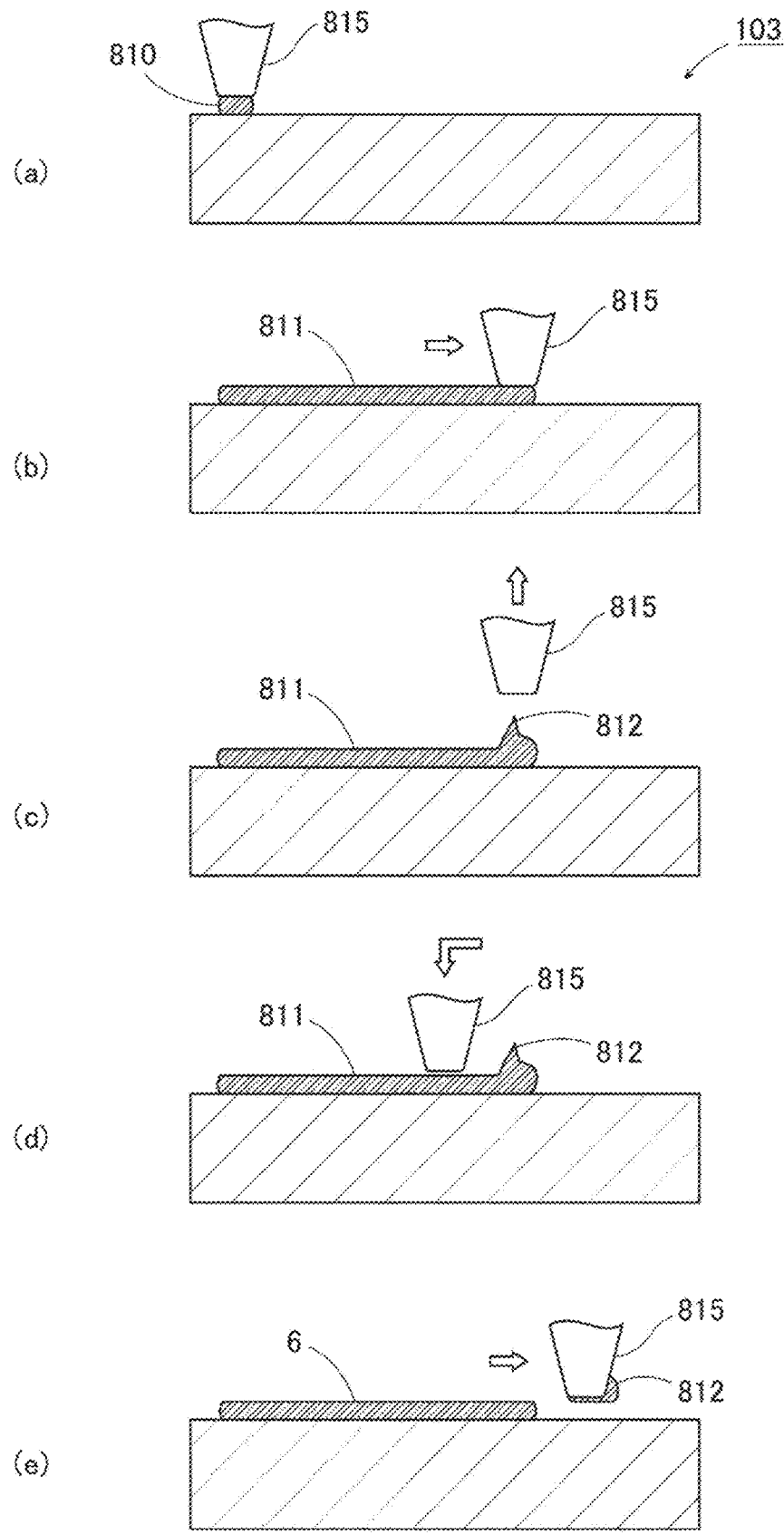
FIG. 6 illustrates an example of the forming process of an anti-reflection film 6 in chronological order.

FIG. 6, including parts (a) to (e), illustrates an example of the forming process of an anti-reflection film 6 in chronological order. Parts (a) and (b) illustrate the application of a resin paint 810 using a fine nozzle 815. The part (a) illustrates the start of the application, and the part (b) illustrates the application in progress. The resin paint 810 is discharged from the tip of the fine nozzle 815. By discharging the resin paint 810 while moving the fine nozzle 815 along the top surface of the ST board 103, the resin film 811 is formed in the region where the anti-reflection film 6 is formed.

The part (c) illustrates the end of the coating process. At the end of application, the resin paint 810 is stopped and the fine nozzle 815 is moved away from the ST board 103. At this time, an angular protrusion 812 is formed in the resin film 811, extending from the end of the coating toward the fine nozzle 815.

The parts (d) and (e) illustrate the removal of the protrusion 812. After the end of the application, the fine nozzle 815 moves along the ST board 103 in the opposite direction of the direction of travel just before the end of the application, and then moves closer to the vicinity of the resin film 811 (see part (d)). Thereafter, the fine nozzle 815 moves in the same direction as the direction of travel just before the end of the application without discharging the resin paint 810, passes the end of the application position, and moves to a position where it does not face the resin film 811. At this time, the resin paint 810 of the protrusion 812 adheres to the tip of the fine nozzle 815, and the resin film 811 from which the protrusion 812 is removed becomes the anti-reflection film 6 (see part (e)). The fine nozzle 815 is then subjected to a cleaning procedure, and the resin paint 810 adhering to the tip is removed.

By employing such a method, the anti-reflection film 6 can be formed without patterning by exposure and development. Since the pattern of the anti-reflection film 6 does not require the same high precision as that of the interlayer wirings 312 to 314 and the via holes 321 to 324, it can be formed by this method of applying the resin paint 810 with a nozzle.

Moreover, by removing the protrusion 812 formed by application using a fine nozzle, the maximum height of the anti-reflection film 6 can be controlled and the protrusion 812 can be prevented from contacting the probe 5 or the electrode terminal 21 of the object to be inspected.

[B] Advantages

Figure 7:
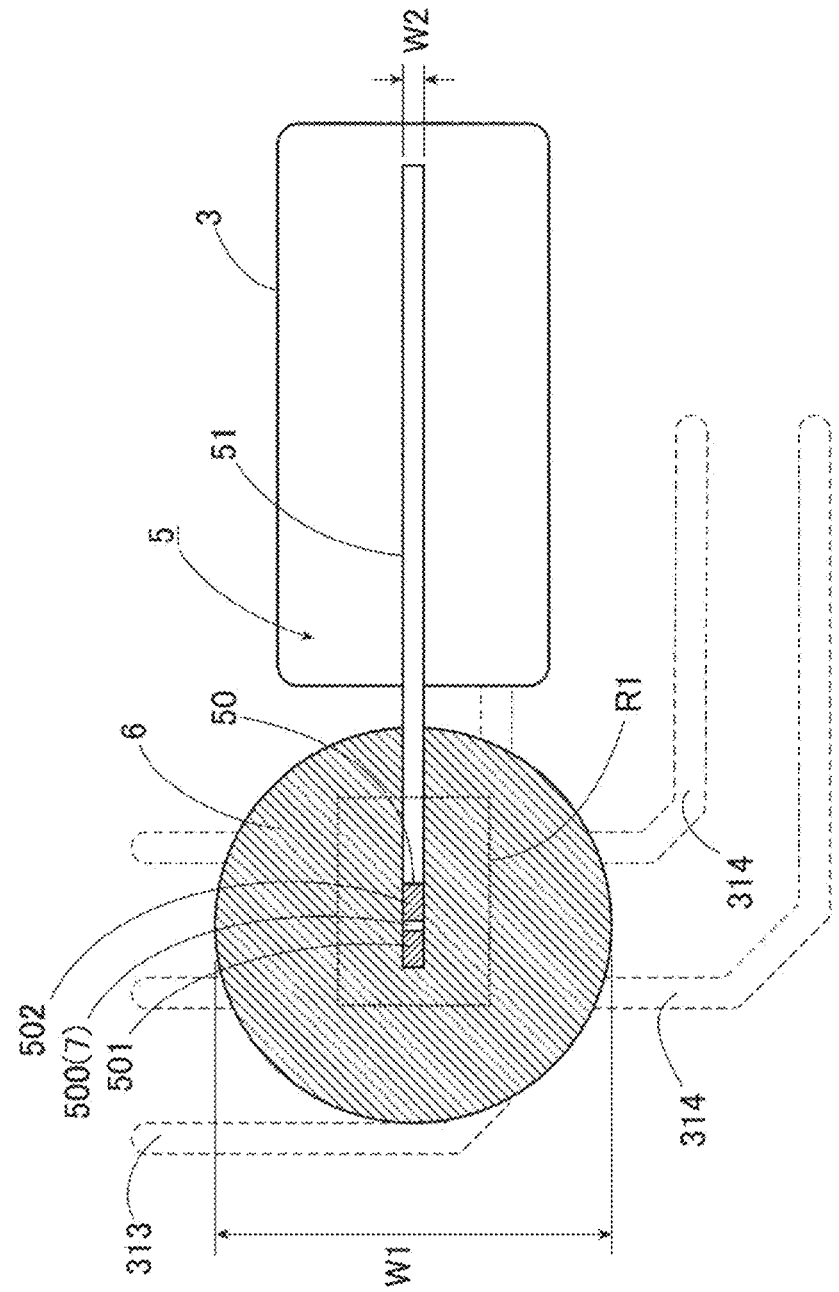
FIG. 7 is a plan view of a probe mounting surface 13.

FIG. 7 is a plan view of a probe mounting surface 13, which corresponds to the image taken by the camera 22.

Since the anti-reflection film 6 is formed on the background surrounding the alignment mark 7, there is no bright area around the alignment mark 7, and the alignment mark 7 can be easily identified.

The anti-reflection film 6 is formed to cover the insulating film 304 in the region including the position corresponding to the alignment mark 7. For example, the anti-reflection film 6 is formed in a circular region centered on the position corresponding to the alignment mark 7.

Since the insulating films 303 and 304 are light transmissive, when illumination light is irradiated, strong reflected light that is totally reflected on the main surfaces of the interlayer wirings 313 and 314 and diffusely reflected on the edges of the interlayer wirings 313 and 314 and the electrode pad 3, etc. becomes stray light in the insulating films 303 and 304, making the insulating films 303 and 304 bright overall. Therefore, except for the region where the anti-reflection film 6 is formed, the region is observed as a bright area.

In contrast, in the region where the anti-reflection film 6 is formed, the reflected light from the insulating film 304 is blocked and the light reflectance from the surface of the anti-reflection film 6 is also small, so the region is observed as a sufficiently dark area. Therefore, there are no bright areas in the background adjacent to the alignment mark 7 that can be easily confused with the alignment mark 7, and the contrast of the alignment mark 7 is not reduced, so the alignment mark 7 can be easily identified.

Moreover, in the shortitudinal direction of the beam part 51, the width W1 of the anti-reflection film 6 can be sufficiently larger than the width W2 of the probe 5. It is difficult to significantly increase the width W2 of the probe 5 because the shape of the probe 5 is constrained by various conditions such as elastic properties, conductive properties, and alignment pitch. Therefore, the identification of the alignment mark 7 can be improved more effectively than when an anti-reflection region is provided on the probe 5.

Figure 8:
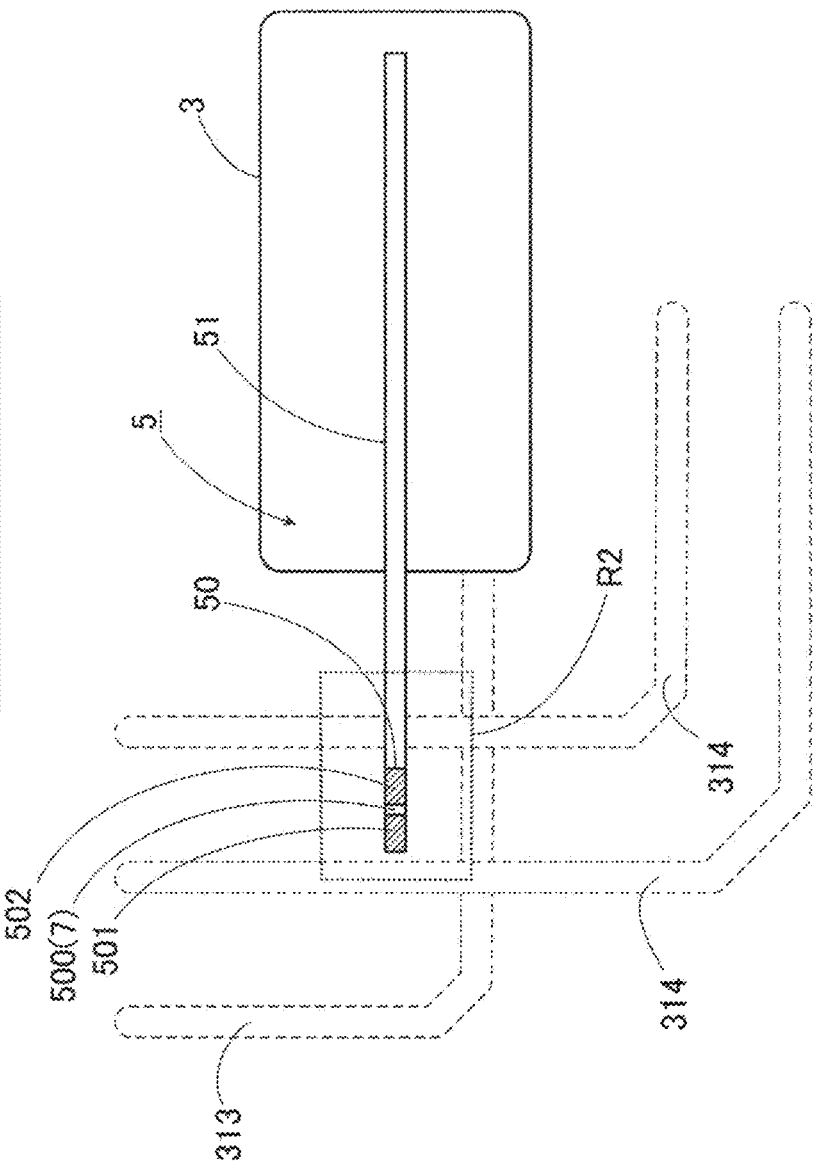
FIG. 8 illustrates a comparative example to be compared with the present invention.

FIG. 8 illustrates a comparative example to be compared with the present invention. If FIG. 8 is compared with FIG. 7, it differs in that it is not equipped with the antireflection film 6. Without the antireflection film 6, the background surrounding the alignment mark 7 becomes a bright area, making it difficult to identify the alignment mark 7.

FIG. 9, including parts (a) and (b), illustrates an example of an image captured by the camera 22. The part (a) illustrates the captured image corresponding to the area R1 in FIG. 7, and the part (b) illustrates the captured image corresponding to the area R2 in FIG. 8. By comparing the Part (a) and (b), it can be seen that the present invention facilitates identification of the alignment mark 7.

[C] Other Configuration Example

Figure 10:
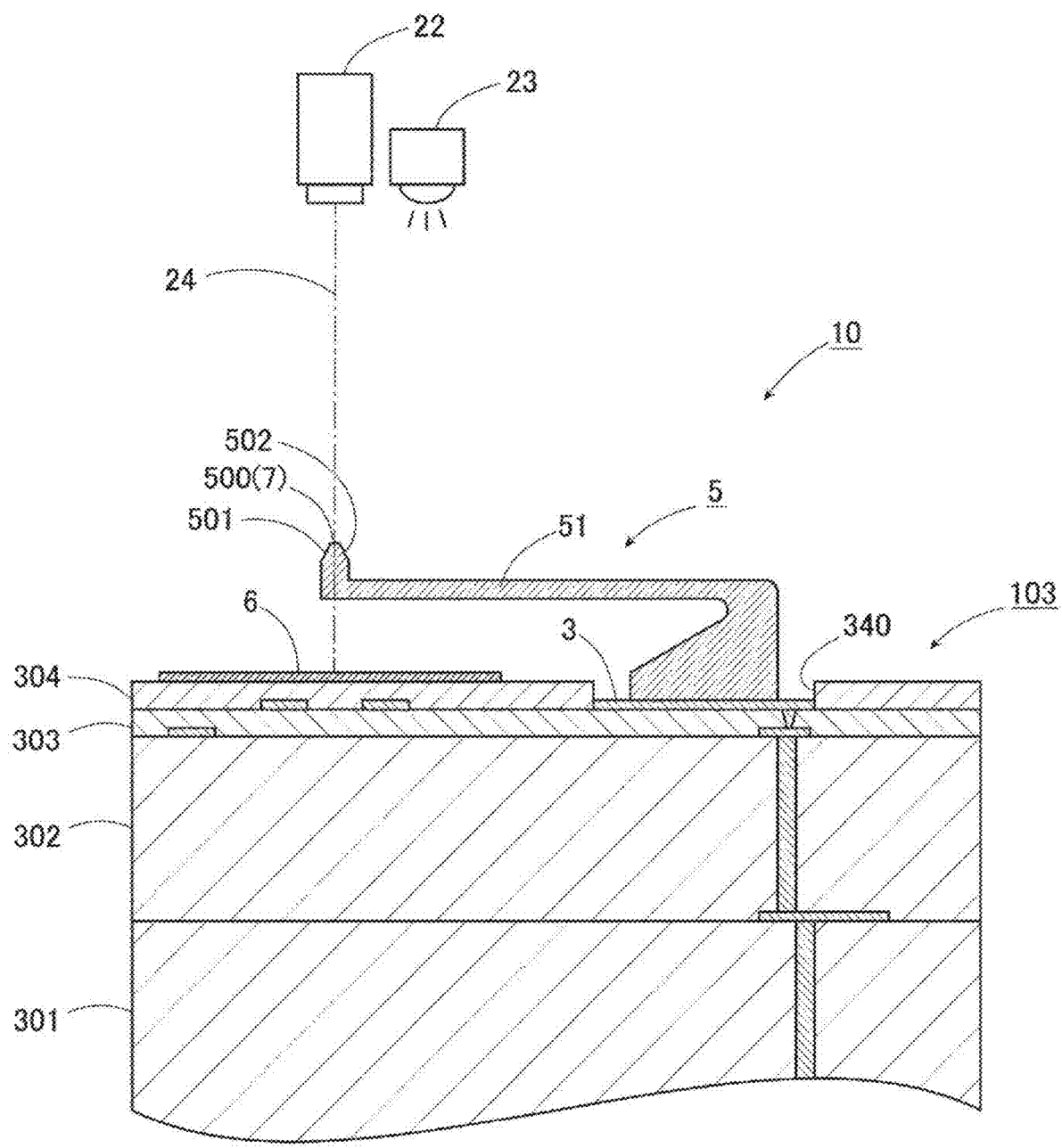
FIG. 10 illustrates another example of a probe card 10 according to the first embodiment of the present invention.

FIG. 10 illustrates another example of a probe card 10 according to the first embodiment of the present invention, similar to FIG. 4, and a cross-sectional view (A-A cross-sectional view) cut by A-A cut line in FIG. 3.

In FIG. 4, the electrode pad 3 is formed on the insulating film 304 formed o the top layer, whereas in FIG. 10, it is formed on the insulating film 303 below the insulating film 304 and exposed through a through-hole 340 in the insulating film 304.

One or more insulating films 303 and 304 may be formed on the probe mounting surface 13 of the ST board 103, as well as the electrode pad 3 may be exposed. In other words, the present invention is not limited only to the case where the electrode pad 3 is formed on the insulating film 304 formed on the top layer.

Although the present embodiment describes a case in which the tip of the contact part 50 of the probe 5 is used as the alignment mark 7, the present invention is not limited to only such a case. For example, the alignment mark 7 may be formed on the beam part 51 near the contact part 50, and the present invention can also be applied to such a probe card 10.

Second Embodiment

In the first embodiment, an example of a case in which the anti-reflection film 6 is formed corresponding to the probe 5 is described. In contrast, the present embodiment describes a case in which the anti-reflection film 6 is formed corresponding to a probe group 530 formed by two or more probes 5.

Figure 11:
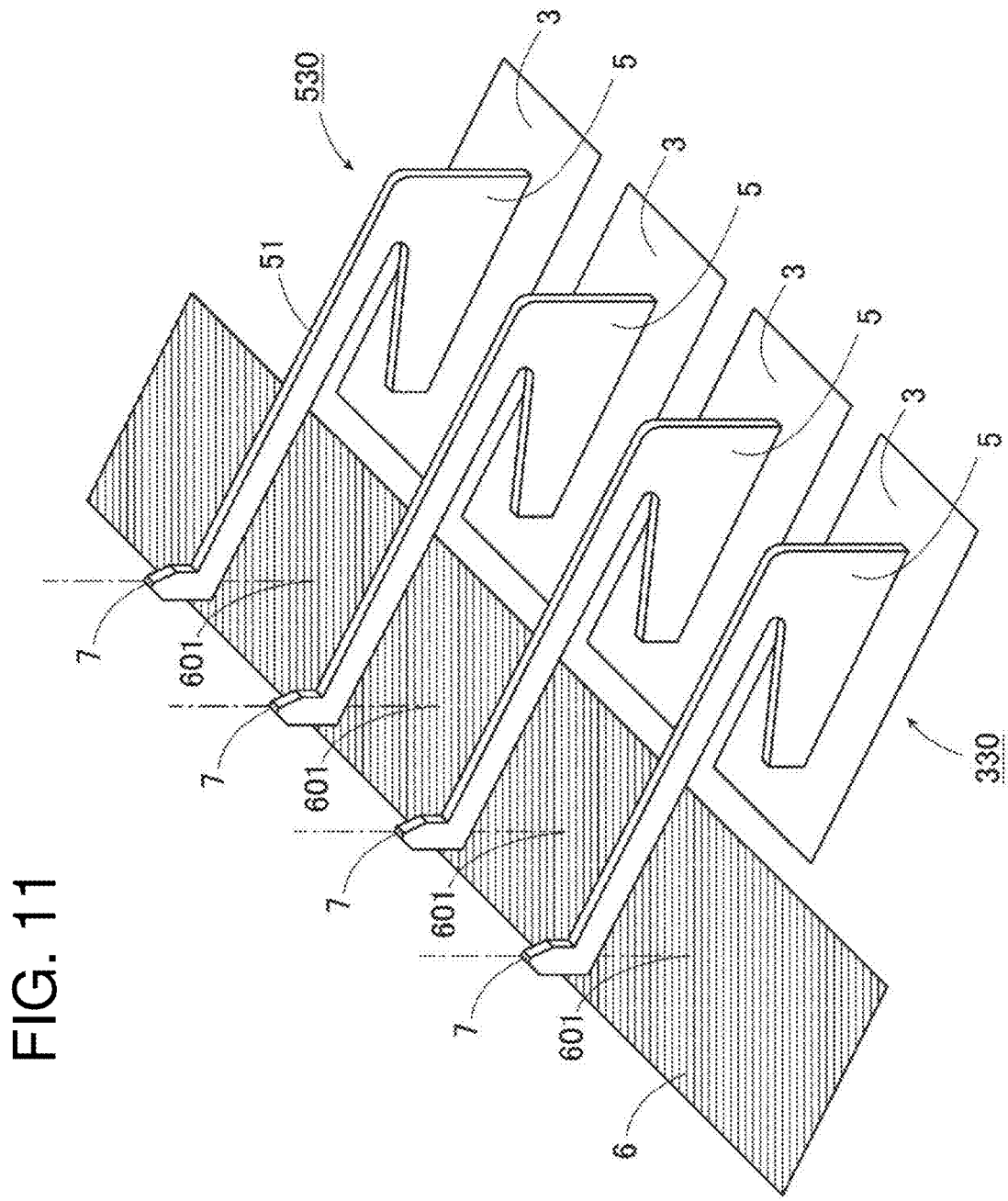
FIG. 11 is another perspective view of the probe mounting surface 13 viewed from the bottom, illustrating an example of a main part of a probe card 10 according to a second embodiment of the present invention.
Figure 12:
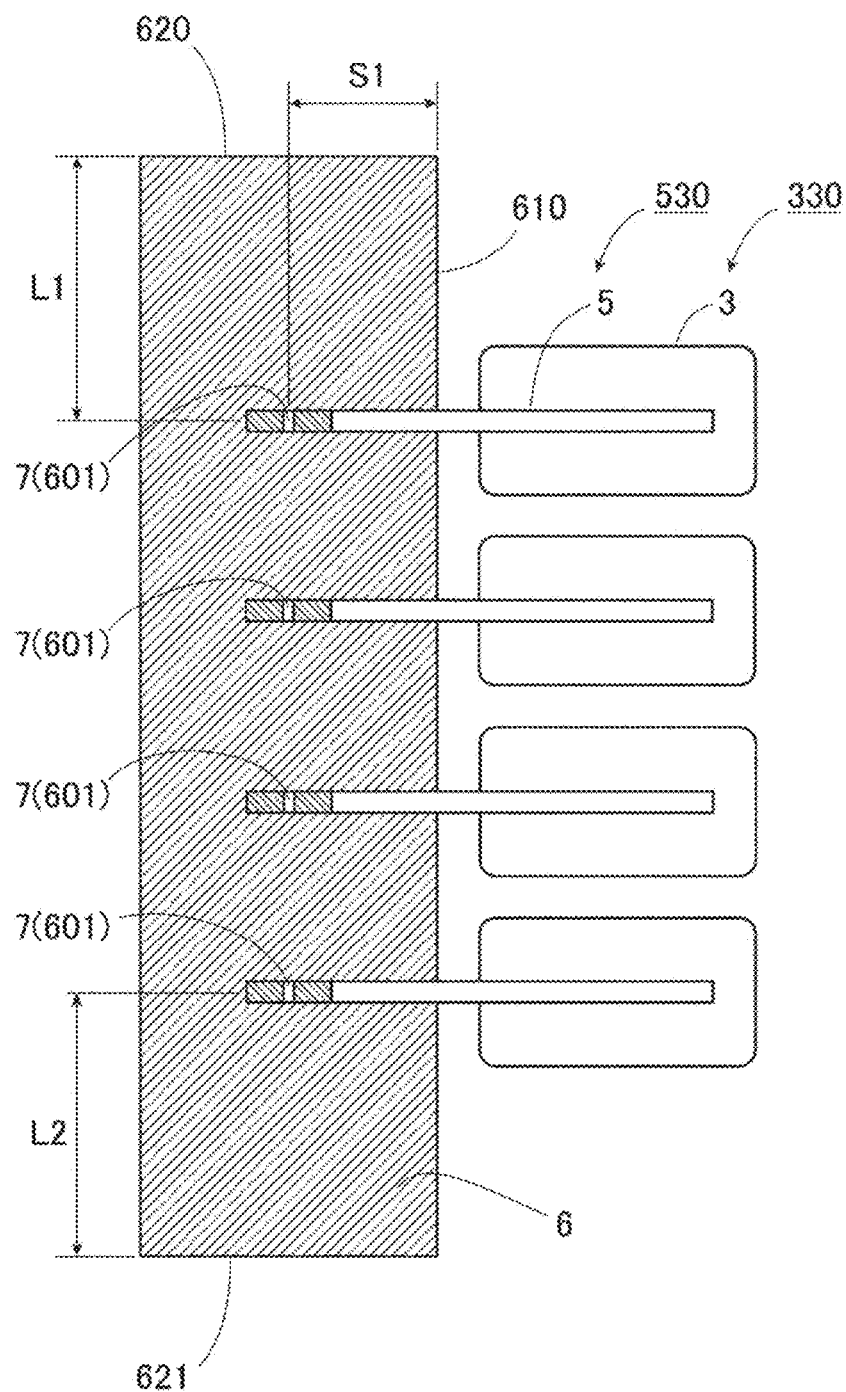
FIG. 12 is another plan view of the probe mounting surface 13.

FIGS. 11 and 12 each illustrates an example of a main part of the probe card 10 according to the second embodiment, focusing on one probe group 530 and illustrating it during alignment. FIG. 11 is another perspective view of the probe mounting surface 13 viewed from the bottom. FIG. 12 is another plan view of the probe mounting surface 13, which corresponds to the image taken by the camera 22.

The probe group 530 has two or more probes 5 corresponding to two or more electrode terminals 21 arranged on the same straight line. Each probe 5 is arranged at a certain distance so that they are parallel to each other and aligned in a direction that intersects the longitudinal direction of the beam part 51. Therefore, the alignment mark 7 of each probe 5 is also located on the same straight line.

The electrode pad group 330 has two or more electrode pads 3 to which each probe 5 of the probe group 530 is attached. In other words, each electrode pad 3 of the electrode pad group 330 is arranged with a certain distance in the same direction as the alignment direction of the probe group 530.

The anti-reflection film 6 is formed corresponding to probe group 530. The anti-reflection film 6 has an elongated rectangle shape extending along the alignment direction of the probe group 530. Within the region where the anti-reflection film 6 is formed, a position 601 corresponding to the alignment mark 7 of each probe 5 of the probe group 530 is included. In other words, for all alignment marks 7 of the probe group 530, the anti-reflection film 6 is formed to cover the corresponding positions 601 on the probe mounting surface 13 and a region surrounding the positions.

Therefore, for any of the alignment marks 7, the anti-reflection film 6 is formed on the background surrounding the alignment marks 7, and there are no bright areas around the alignment marks 7, allowing all the alignment marks 7 to be easily identified.

By forming one anti-reflection film 6 corresponding to two or more probes 5, the number of times the resin paint is applied can be reduced and the number of cleaning processes of the fine nozzle 815 at the end of the application can be reduced compared to the case where the anti-reflection film 6 is formed for each alignment mark 7.

The anti-reflection film 6 is formed so that it does not overlap with the electrode pad 3, preventing the electrode pad 3 from becoming narrower. The width of the anti-reflection film 6 in the shortitudinal direction is limited by the electrode pad 3. In contrast, since no such limitation exists for the length of the anti-reflection film 6 in the longitudinal direction, the anti-reflection film 6 is formed so that both ends 620 and 621 in the longitudinal direction extend beyond the electrode pad group 330. Therefore, for the longitudinal direction of the anti-reflection film 6, compared to the shortitudinal direction, it is possible to prevent the alignment mark 7 from being more difficult to identify by the background farther from the alignment mark 7.

The distance S1 in the figure is the distance from the position 601 corresponding to the alignment mark 7 to the shortitudinal end 610 of the anti-reflection film 6, which is shorter than the distance to the electrode pad 3. The distances L1 and L2 in the figure are the distances from the longitudinal ends 620 and 621 of the anti-reflection film 6 to the position 601 corresponding to the nearest alignment mark 7, both longer than the distance S1 from the shortitudinal end 610.

Third Embodiment

In the second embodiment, an example of a case in which the anti-reflection film 6 is formed corresponding to one probe group 530 is described. In contrast, the present embodiment describes a case in which the anti-reflection film 6 is formed corresponding to two adjacent probe groups 531 and 532.

Figure 13:
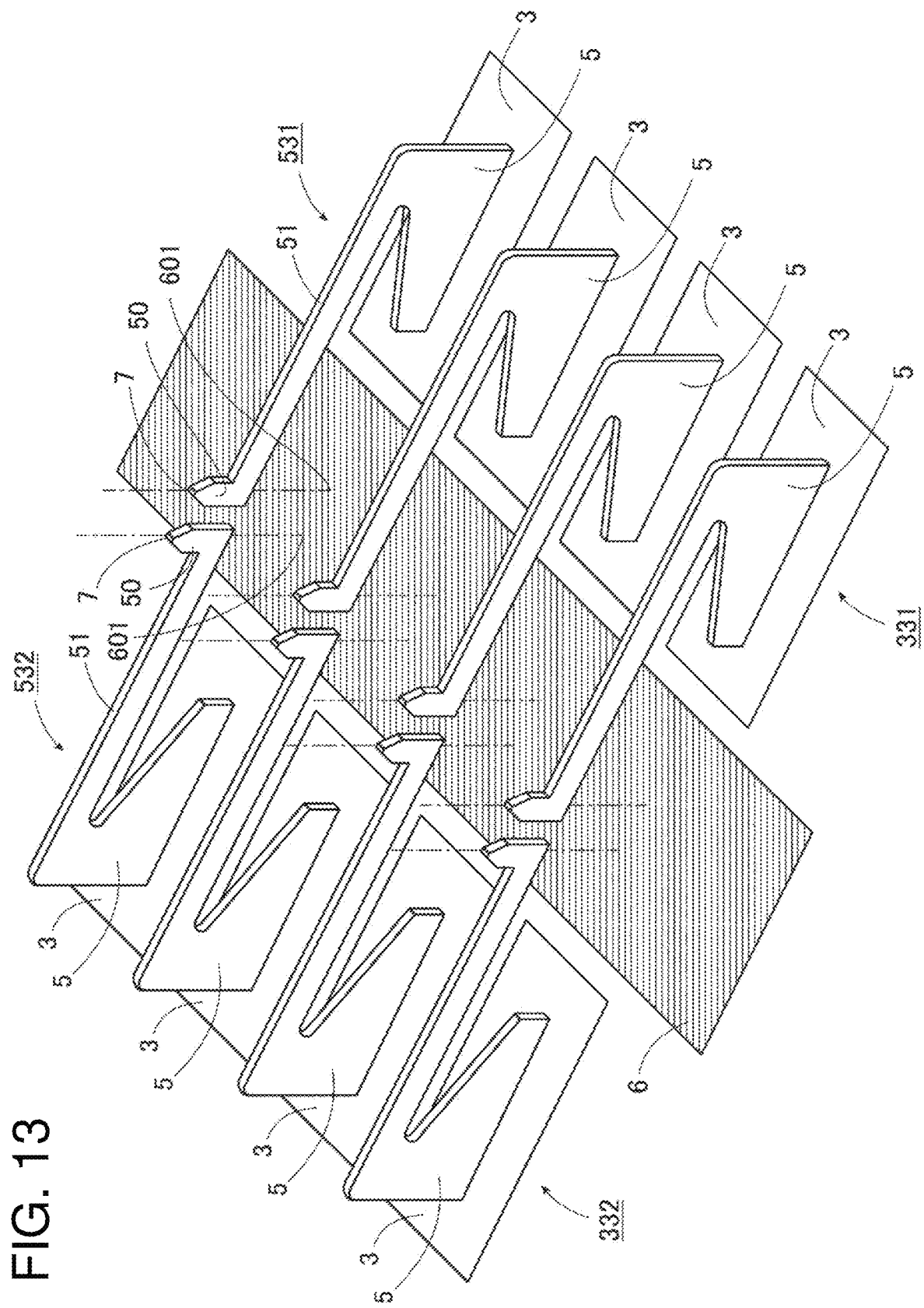
FIG. 13 is another perspective view of the probe mounting surface 13 viewed from the bottom, illustrating an example of a main part of a probe card 10 according to a third embodiment of the present invention.
Figure 14:
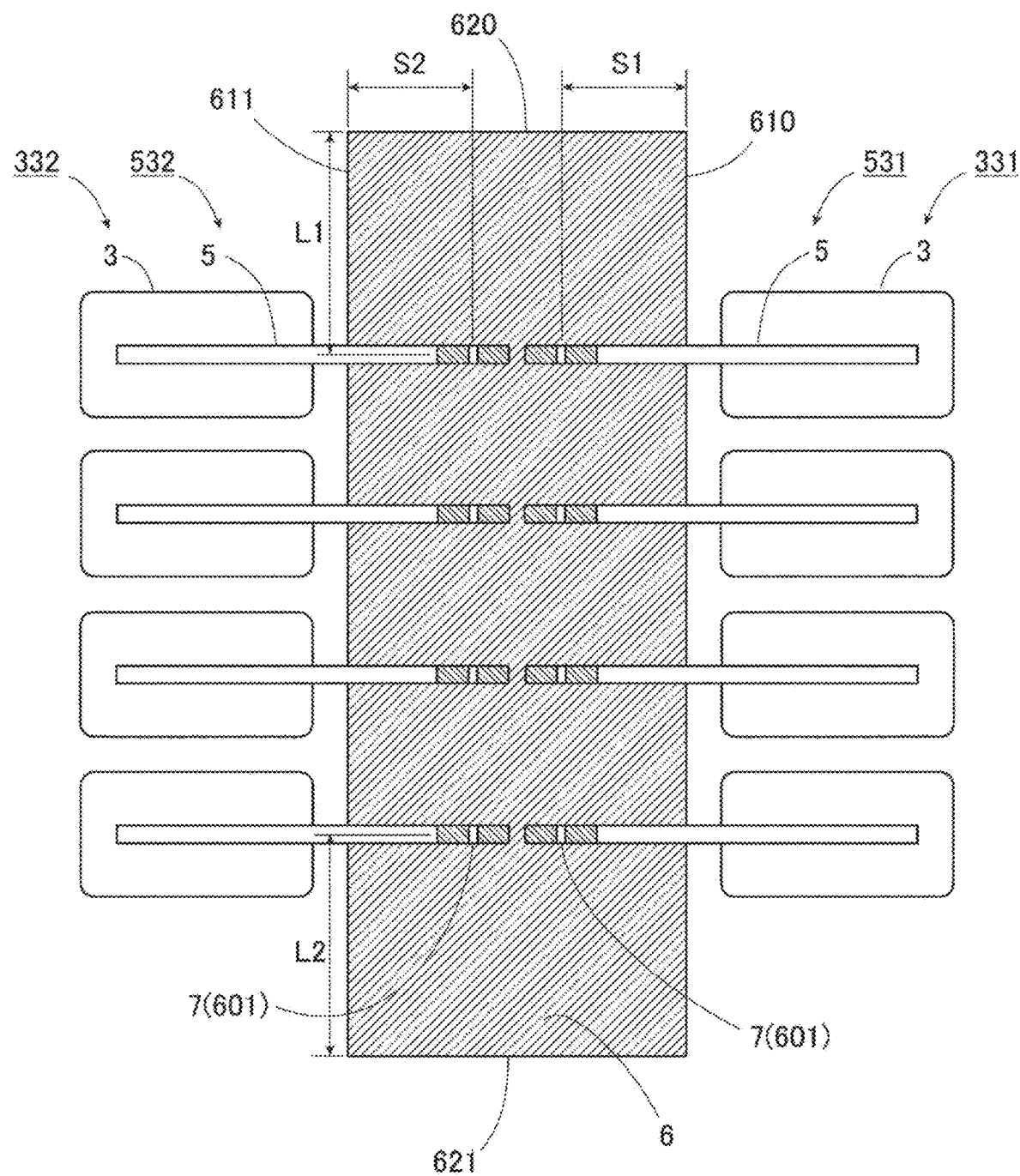
FIG. 14 is another plan view of the probe mounting surface 13.

FIGS. 13 and 14 each illustrates an example of a main part of the probe card 10 according to the third embodiment, focusing on two probe groups 531 and 532 and illustrating it during alignment. FIG. 13 is another perspective view of the probe mounting surface 13 viewed from the bottom. FIG. 14 is another plan view of the probe mounting surface 13, which corresponds to the image taken by the camera 22.

Each probe group 531 and 532 has the same configuration as the probe group 530 (of the second embodiment). That is, they have two or more probes 5 corresponding to two or more electrode terminals 21 arranged on the same straight line. The two probe groups 531 and 532 are arranged adjacent to each other so that they are parallel to each other, and the contact parts 50 of the different probe groups 531 and 532 are arranged facing each other.

Electrode pad groups 331 and 332 each have the same configuration as electrode pad group 330 (of the second embodiment). The electrode pad groups 331 and 332 correspond to the probe groups 531 and 532, respectively.

The anti-reflection film 6 is formed corresponding to the two probe groups 531 and 532 and is positioned between the two electrode pad groups 331 and 332. The region where the anti-reflection film 6 is formed has an elongated rectangle shape extending along the alignment direction of the probe groups 531 and 532. Within the region, a position 601 corresponding to the alignment mark 7 of each probe 5 of the probe groups 531 and 532 is included. In other words, for all alignment marks 7 of the probe groups 531 and 532, the anti-reflection film 6 is formed to cover the corresponding positions 601 on the probe mounting surface 13 and a region surrounding the positions.

Therefore, for any of the alignment marks 7, the anti-reflection film 6 is formed on the background surrounding the alignment marks 7, and there are no bright areas around the alignment marks 7, allowing all the alignment marks 7 to be easily identified.

By forming one anti-reflection film 6 corresponding to two probe groups 531 and 532, the number of times the resin paint is applied can be reduced and the number of cleaning processes of the fine nozzle 815 at the end of the application can be reduced compared to the case where the anti-reflection film 6 is formed for each of the probe groups 531 and 532.

The anti-reflection film 6 is formed so that it does not overlap with the electrode pad 3, preventing the electrode pad 3 from becoming narrower. The anti-reflection film 6 is formed so that both ends 620 and 621 in the longitudinal direction extend beyond the electrode pad groups 331 and 332. Therefore, for the longitudinal direction of the anti-reflection film 6, compared to the shortitudinal direction, it is possible to prevent the alignment mark 7 from being more difficult to identify by the background farther from the alignment mark 7.

The distances S1 and S2 in the figure are the distances from the position 601 corresponding to the alignment mark 7 to the shortitudinal ends 610 and 611 of the anti-reflection film 6, which are shorter than the distances to the electrode pad 3. The distances L1 and L2 in the figure are the distances from the longitudinal ends 620 and 621 of the anti-reflection film 6 to the position 601 corresponding to the nearest alignment mark 7, both longer than the distances S1 and S2 from the shortitudinal ends 610 and 611.

Figure 15:
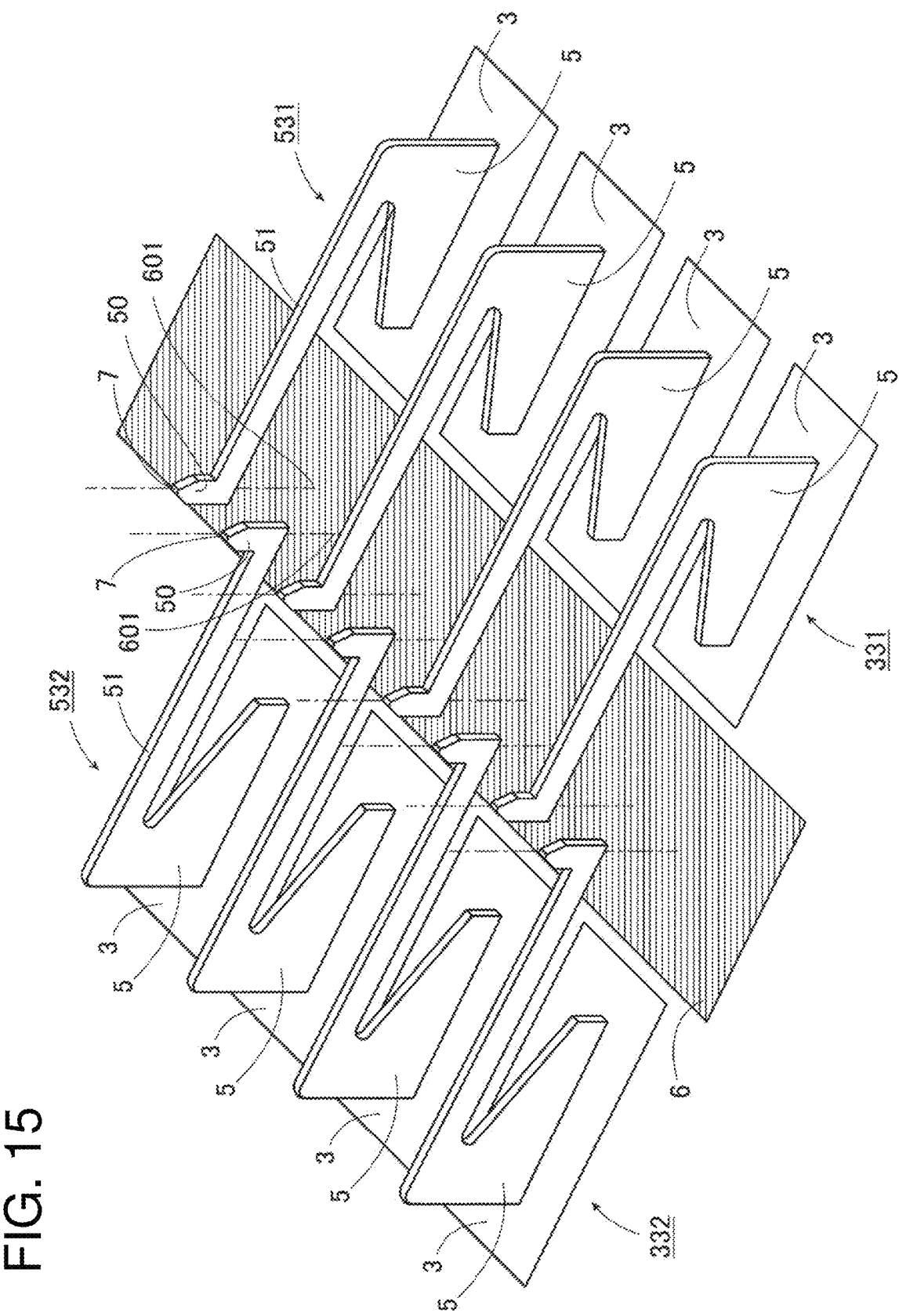
FIG. 15 is another perspective view of the probe mounting surface 13 viewed from the bottom, illustrating an another example of a main part of a probe card 10 according to the third embodiment of the present invention.
Figure 16:
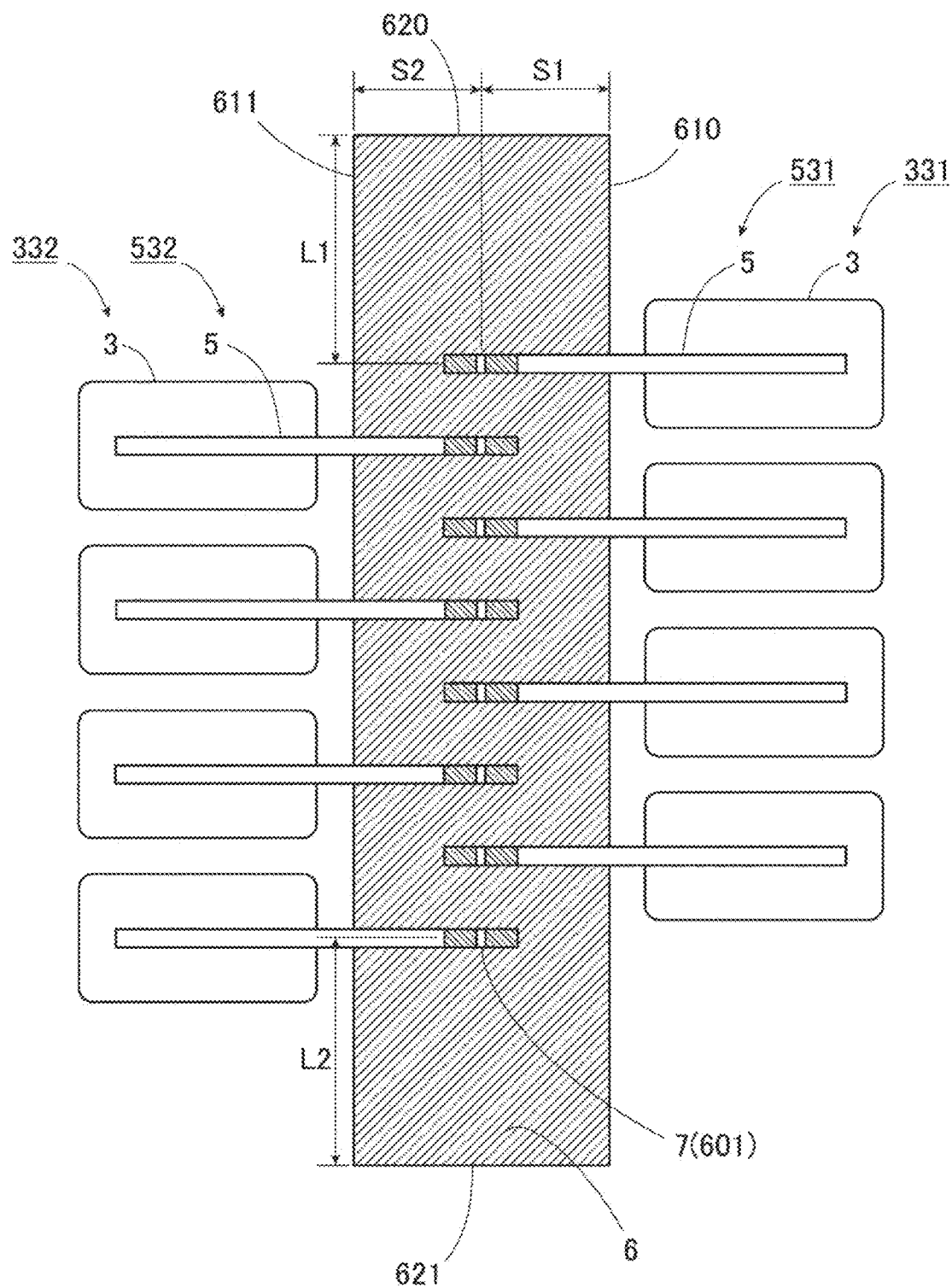
FIG. 16 is another plan view of the probe mounting surface 13.

FIGS. 15 and 16 each illustrates another example of a main part of the probe card 10 according to the third embodiment, focusing on two probe groups 531 and 532 and illustrating it during alignment. FIG. 15 is another perspective view of the probe mounting surface 13 viewed from the bottom. FIG. 16 is another plan view of the probe mounting surface 13, which corresponds to the image taken by the camera 22.

The probes 5 of different probe groups 531 and 532 are arranged alternately, and the contact part 50 of each probe 5 of the two probe groups 531 and 532 is arranged on the same straight line. The other configuration is exactly the same as in FIGS. 13 and 14. The present invention can be applied to such a probe card 10.

REFERENCE SIGNS LIST

3 ELECTRODE PAD
5 PROBE
6 ANTI-REFLECTION FILM
7 ALIGNMENT MARK
10 PROBE CARD
11 EXTERNAL TERMINAL
12 BOARD HOLDER
13 PROBE MOUNTING SURFACE
20 SEMICONDUCTOR WAFER
21 ELECTRODE TERMINAL
22 CAMERA
23 ILLUMINATOR
24 LIGHT RECEIVING AXIS
50 CONTACT PART
51 BEAM PART
52 BASE PART
100 MAIN BOARD
101 REINFORCING PLATE
102 INTERPOSER
103 ST BOARD
200 STAGE
201 CARD HOLDER
301, 302 CERAMIC BOARD
303, 304 INSULATING FILM
312 to 314 INTERLAYER WIRING
321 to 324 VIA HOLE
330 to 332 ELECTRODE PAD GROUP
340 THROUGH-HOLE
500 CONTACT SURFACE
501, 502 TAPERED SURFACE
530 to 532 PROBE GROUP
601 POSITION CORRESPONDING TO ANTI-REFLECTION FILM
610, 611, 620, 621 END OF ANTI-REFLECTION FILM

800 COATING LAYER
801 EXPOSED REGION
802 NON-EXPOSED REGION
805 PHOTOSENSITIVE ILLUMINATION LIGHT
810 RESIN PAINT
811 RESIN FILM
812 PROTRUSION
815 FINE NOZZLE
L1, L2 DISTANCE IN LONGITUDINAL DIRECTION
S1, S2 DISTANCE IN SHORTITUDINAL DIRECTION

The invention claimed is:

1. A probe card comprising:
a circuit board on which an insulating film and an electrode pad are formed; and
a probe attached onto the electrode pad, wherein
the probe includes an alignment mark identifiable from an opposite side of the circuit board,
the alignment mark is positioned outside of the electrode pad on the circuit board,
the insulating film is a light-transmissive thin film covering an interlayer wiring, an anti-reflection film with lower light transmittance than the insulating film being formed in some regions on the insulating film, and
the anti-reflection film is formed on a position corresponding to the alignment mark and a region surrounding the position.

2. The probe card of claim 1, wherein the anti-reflection film is light impermeable.

3. The probe card of claim 1, wherein the insulating film is made of a photosensitive polymer and patterned by processes of exposure and development.

4. The probe card of claim 1, wherein the anti-reflection film is formed by selective application using a fine nozzle.

5. The probe card of claim 1, wherein the anti-reflection film has a lower reflectance than the insulating film.

6. The probe card of claim 1, wherein the anti-reflection film is formed so that it does not overlap with the electrode pad.

7. The probe card of claim 1, wherein
a plurality of the probes is aligned in a predetermined direction to form a probe group, and
the anti-reflection film has an elongated shape extending along the probe group and is formed on a position corresponding to the alignment mark of the plurality of the probes of the probe group and a region surrounding the position.

8. The probe card of claim 7, wherein
two of the probe groups are arranged parallel to each other, and
the anti-reflection film is formed between the two probe groups and on a position corresponding to the alignment mark of the plurality of the probes of each of the two probe groups and a region surrounding the position.

9. The probe card of claim 7, wherein a distance from both ends of the anti-reflection film in a longitudinal direction to a position corresponding to a nearest alignment mark is longer than a distance from both ends of the anti-reflection film in the shortitudinal direction to a position corresponding to the alignment mark.

* * * * *